United States Patent [19]

Nakajima et al.

[11] Patent Number: 4,847,110

[45] Date of Patent: Jul. 11, 1989

[54] TRANSFER RECORDING MEDIUM AND PROCESS FOR PRODUCTION THEREOF

[75] Inventors: Kazuhiro Nakajima; Toshiharu Inui; Noriyoshi Ishikawa; Masashi Miyagawa, all of Yokohama, Japan

[73] Assignee: Canon Kabushiki Kaisha, Tokyo, Japan

[21] Appl. No.: 94,740

[22] Filed: Sep. 9, 1987

[30] Foreign Application Priority Data

| Sep. 10, 1986 | [JP] | Japan | 61-211471 |
| Sep. 12, 1986 | [JP] | Japan | 61-213810 |
| Sep. 18, 1986 | [JP] | Japan | 61-217895 |
| Sep. 25, 1986 | [JP] | Japan | 61-224803 |
| Sep. 25, 1986 | [JP] | Japan | 61-224804 |
| Sep. 25, 1986 | [JP] | Japan | 61-224806 |
| Sep. 25, 1986 | [JP] | Japan | 61-224814 |
| Mar. 26, 1987 | [JP] | Japan | 62-70275 |
| Jul. 20, 1987 | [JP] | Japan | 62-179194 |

[51] Int. Cl.$^4$ .................... B05D 1/28; B41M 3/12
[52] U.S. Cl. .................... 427/25; 427/13; 427/146; 427/150; 427/153; 427/202; 427/214; 427/322; 427/326; 427/348; 427/35; 427/354; 427/385.5

[58] Field of Search ............ 427/150, 153, 146, 202, 427/296, 359, 363, 348, 322, 326, 214, 25, 13, 350, 385.5

[56] References Cited

U.S. PATENT DOCUMENTS

| 2,890,969 | 6/1959 | Schossberger et al. | 427/153 |
| 3,503,783 | 3/1970 | Evans | 427/146 |
| 4,121,932 | 10/1978 | Ishida | 427/150 |
| 4,211,437 | 7/1980 | Myers et al. | 427/150 |
| 4,578,340 | 3/1986 | Saccocio et al. | 427/150 |
| 4,597,993 | 7/1986 | Okada et al. | 427/150 |

Primary Examiner—Janyce Bell
Attorney, Agent, or Firm—Fitzpatrick, Cella, Harper & Scinto

[57] ABSTRACT

A transfer recording medium comprising a substrate and a plurality of image forming elements bonded thereto by a binder is provided. The surface of each image forming element at least partially protrudes out of the binder. Such transfer recording medium may be prepared by applying the binder onto the substrate in a prescribed thickness, disposing the image forming elements in excess on the binder, and then removing the excess of the image forming elements. The thus prepared transfer recording medium provides an image having a high density and a faithfully reproducible color.

12 Claims, 10 Drawing Sheets

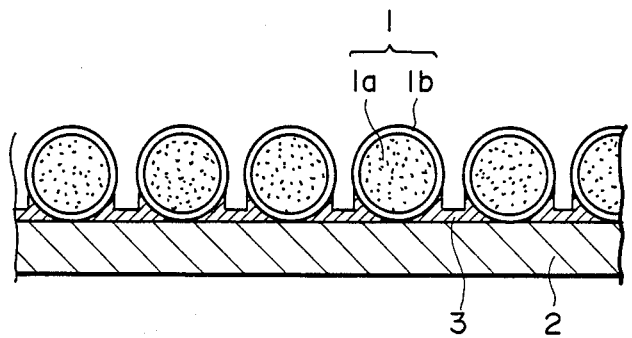
F I G. 1
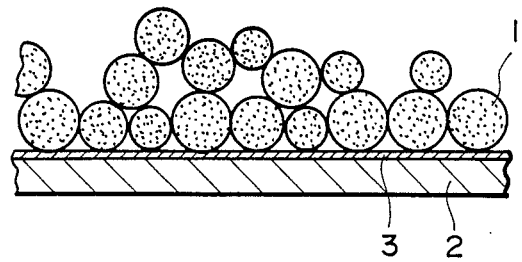
F I G. 2A
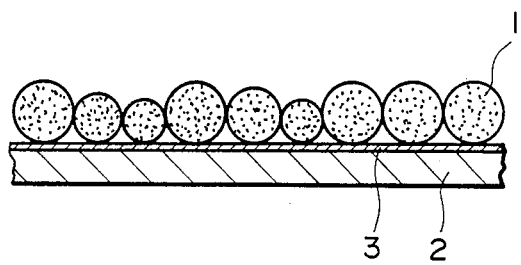
F I G. 2B

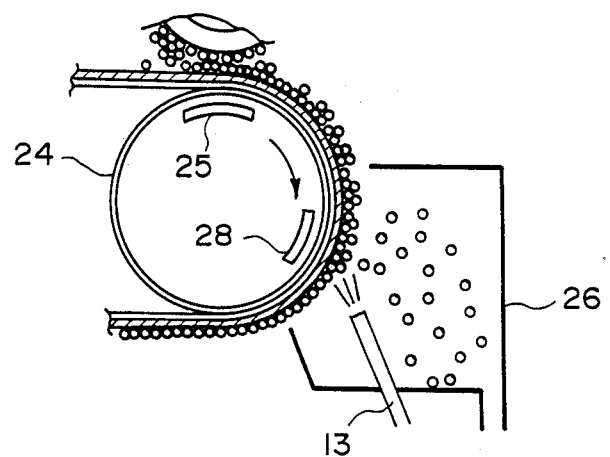
F I G. 7
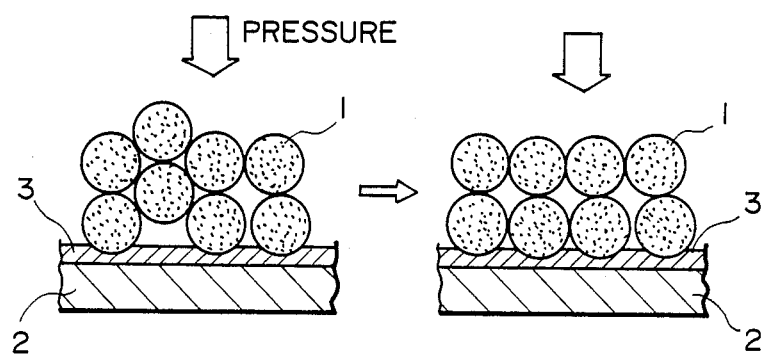
F I G. 8

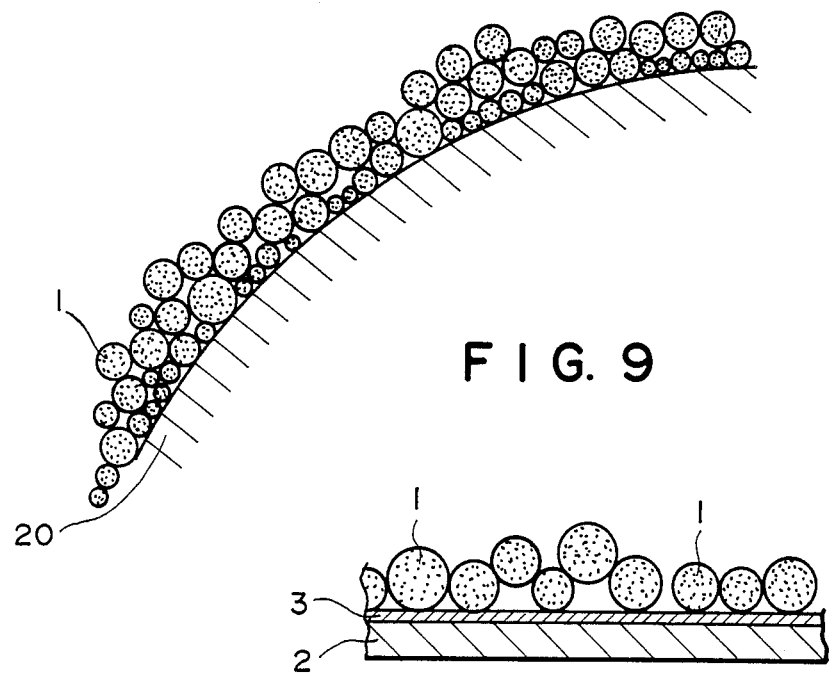
FIG. 9
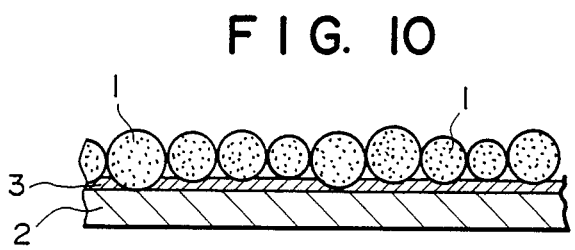
FIG. 10
FIG. 11
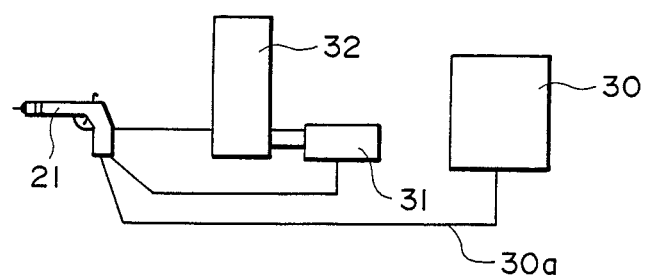
FIG. 12

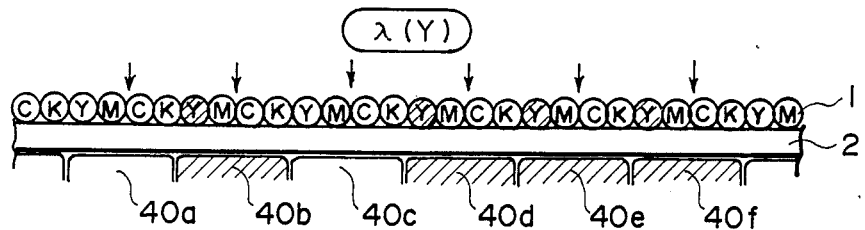
F I G. 13A
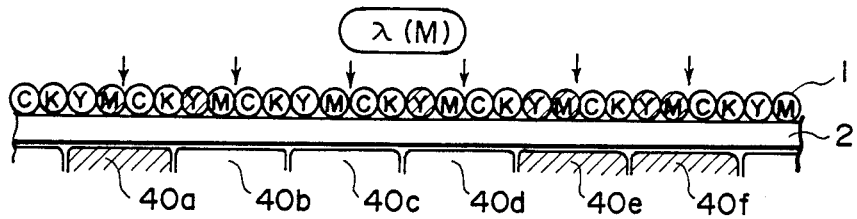
F I G. 13B
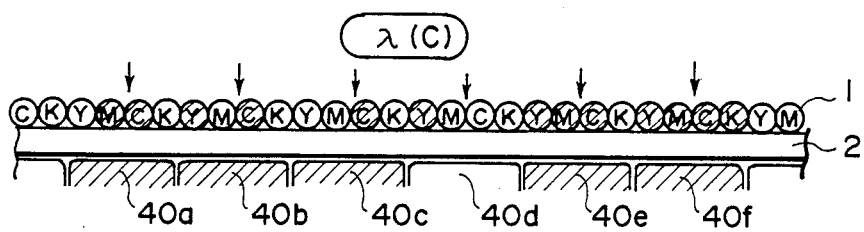
F I G. 13C
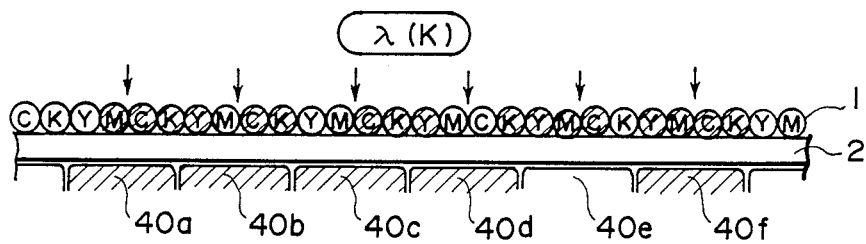
F I G. 13D
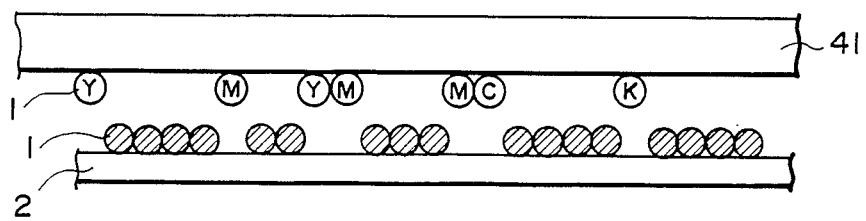
F I G. 13E

TRANSFER RECORDING MEDIUM AND PROCESS FOR PRODUCTION THEREOF

FIELD OF THE INVENTION AND RELATED ART

The present invention relates to a transfer recording medium applicable for printers, copying machines, facsimile machines, etc., and a process for production thereof.

In recent years, accompanying the rapid progress of the information industry, various information processing systems have been developed. Furthermore various recording methods have been developed which corresponding to the respective information processing systems. For example one such color recording or medium-tone recording method employs a recording medium comprising a substrate and particulates or microcapsules disposed thereon which have mutually different color tones or optical densities and correspondingly mutually different melting or softening points.

For example, U.S. Pat. No. 4,399,209 discloses an image forming method wherein photopolymerization is applied to color recording. Accordingly, a recording medium is provided comprising a substrate paper, a chromogenic layer applied thereon, and microcapsules of a radiation curable material randomly disposed on the chromogenic layer and which can show generate each of three primary colors of yellow, magenta at selective cyan by reacting with the chromogenic layer, and to wavelengths. Such recording medium is sequentially subjected to positive exposures corresponding to the primary three colors, and thereafter it is pressed so that the uncured microcapsules are raptured and react with the chromogenic layer to develop the color, whereby a multi-color image is obtained.

Further, U.S. Pat. No. 4,416,966 discloses a "self-contained image-forming system wherein an image-forming sheet comprising photosensitive microcapsules and a developer are both disposed on the same substrate surface. In this system, the imageforming sheet is exposed mainly to ultraviolet rays corresponding to an image to be recorded, and then it is passed through pressing rollers so that the microcapsules are raptured and the internal phase thereof is ejected. At this time, chromogenic material migrates to the developer ordinarily disposed in another layer and the chromogenic material reacts there to form a multi-color image.

In the conventional recording methods as mentioned above, in order to easily effect development under pressure after the exposure, the encapsulated or core material of the microcapsules is, in many cases, a liquid photosensitive composition at normal temperature. problems may arise when the encapsulated material is insufficiently transferred, thus lowering the density of a recorded image or the fidelity of the color thereof.

SUMMARY OF THE INVENTION

A principal object of the present invention is to provide a recording medium capable of providing a recorded image having a high density and a faithfully reproducible color by sufficiently transferring particulates or microcapsules contained therein to a transfer receiving medium.

Another object of the present invention is to provide a process for producing a recording medium capable of providing a recorded image having a high density and a faithfully reproducible color.

The present invention provides a transfer recording medium comprising a substrate, a finder layer disposed thereon, and a plurality of image forming elements bonded to the substrate by the binder; wherein the surface of each image forming element at least partially protrudes through the binder.

The present invention further provides a process for producing a transfer recording medium comprising a substrate and a plurality of image forming elements disposed thereon, which comprises: applying onto the substrate a binder for bonding the image forming elements to the substrate to form a layer of the binder having a level of below the number-average particle size of the image forming elements; disposing the image forming elements on the binder in excess of an amount sufficient to provide a densely packed mono-particle layer of the image forming elements; and removing the excess of the image forming elements from the substrate to leave a densely packed substantially mono-particle layer of the image forming elements.

In the transfer recording medium according to the present invention, since the surface of each image forming element at least partially protrudes out of the binder, the image forming elements may be easily transferred to a transferreceiving medium (or a medium to be transfer-printed) without hindrance due to the binder. Accordingly, in the present invention, the transfer of the image forming elements is effected whereby a recorded image having a high density and faithfully reproducible color is obtained.

Further, in the process for producing a recording medium according to the present invention, image forming elements are disposed on a substrate after the binder layer is formed since the binder layer has a level or thickness of below the number-average particle size of the image forming elements on the substrate, no binder is attached to an upper surface of the image forming element (i.e., a surface portion opposite to that contacting the binder layer or the substrate). Therefore, the transfer efficiency of the image forming elements is increased, and ordinarily the binder is not transferred to a transfer-receiving medium, whereby a good recorded image of high image quality is obtained.

Furthermore, in the process for producing a transfer recording medium according to the present invention, since the binder is not attached to the entire surface of the image forming element, an excess image forming elements are easily removed after the image forming elements are disposed on the binder layer in a multilayer form. Therefore, the proportion of the image forming elements constituting a monoparticle layer is increased, and the transfer efficiency of the image forming elements is increased. Further, since the image forming elements are densely disposed on the substrate in the present invention, a transfer recording medium capable of providing a clear recorded image is obtained.

On the contrary, in a conventional process wherein microcapsules are dispersed in a binder and the resultant mixture is applied to a substrate, the microcapsules are disposed on the substrate in a multilayer form due to the adhesion of the binder. Therefore, when the encapsulated material of the microcapsules in the lower layer (a layer disposed close to the substrate) is to be transferred, the transfer thereof is hindered by the other microcapsules in the upper layer. Further, the surfaces of the microcapsules are covered with the binder, the transfer of the encapsulated material is hindered by the binder itself. As a result, in the prior art, the density of a recorded image is lowered or the color thereof cannot be reproduced faithfully.

Incidentally, in the above-mentioned U.S. Pat. No. 4,399,209, a slurry consisting of microcapsules and distilled water is applied to a substrate and then heated up to 95° C., to prepare the recording medium. More specifically, in the above process, the microcapsules are held to the substrate by the adhesion of the wall material of the microcapsule itself. In this case, however, the microcapsules are bonded to each other, whereby the microcapsules are disposed on the substrate in a multilayer form. Further, in such a process, even if an excess of microcapsules were to be removed from those disposed in the multilayer form, it would be difficult to selectively remove the excess of microcapsules because all the microcapsules are mutually bonded.

These and other objects, features and advantages of the present invention will become more apparent upon a consideration of the following description of the preferred embodiments of the present invention taken in conjunction with the accompanying drawings, wherein like parts are denoted by like reference numerals.

BRIEF DESCRIPTION OF THE DRAWINGS

FIG. 1 is a schematic side sectional view showing an embodiment of the transfer recording medium according to the present invention;

FIG. 2A is a schematic side view showing a state wherein image forming elements are disposed on a binder layer in a multilayer form; FIG. 2B is a schematic side view showing a state wherein excess image forming elements are removed from the state shown in FIG. 2A;

FIGS. 3 to 7 and FIG. 19 are respectively a schematic side view showing an example of a system arrangement for practicing the process for producing a transfer recording medium according to the present invention;

FIG. 8 is a schematic side view showing a state of the image forming elements disposed on a substrate in the process for producing a transfer recording medium which uses the system shown in FIG. 6;

FIG. 9 is a partial schematic view showing a state of the image forming elements disposed on an intermediate member shown in FIG. 6;

FIGS. 10 and 11 are schematic side views showing a change in states when the image forming elements disposed on the substrate are pressed after the removal of excess image forming elements in a process for producing the transfer recording medium according to the present invention;

FIG. 12 is a block diagram showing an electrostatic painting gun and peripheral equipment used in the system shown in FIG. 6;

FIG. 13A–13E are schematic side views showing a relationship between the transfer recording medium of the present invention and a thermal head involved in a method using the transfer recording medium;

DETAILED DESCRIPTION OF THE INVENTION

Figure 3:
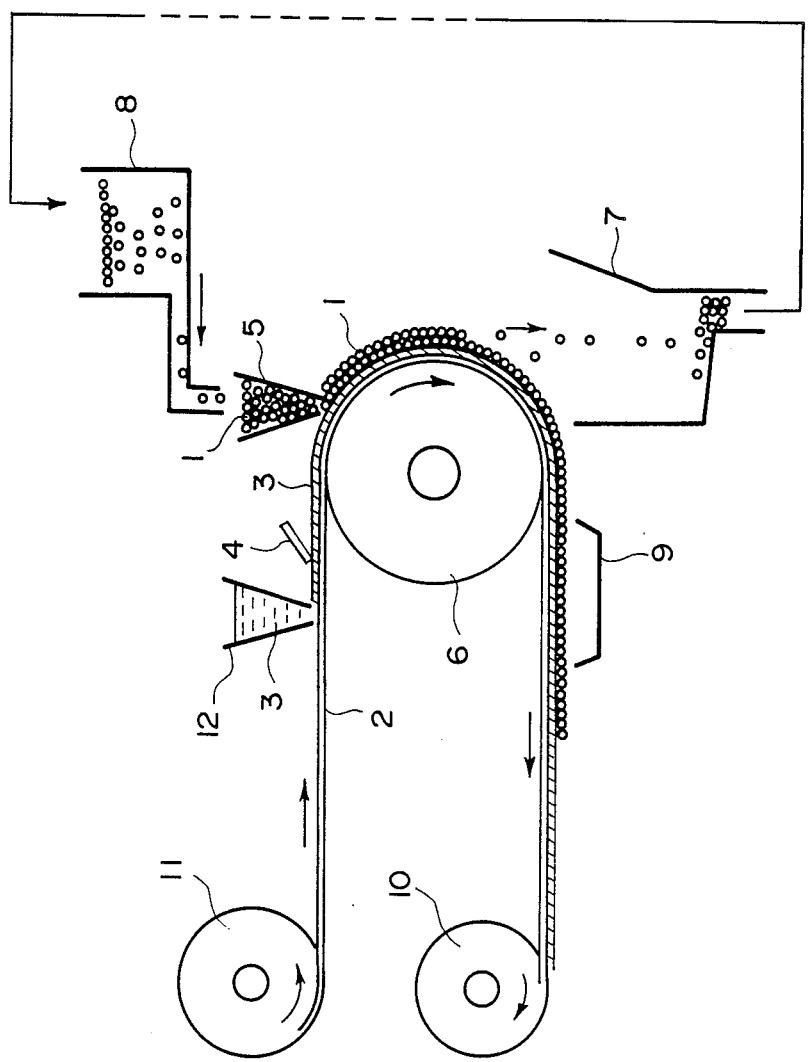

FIG. 1 shows an embodiment of the transfer recording medium according to the present invention.

Referring to FIG. 1, the transfer recording medium of the present invention comprises a substrate 2, a layer of a binder 3 disposed on the substrate 2, and a plurality of image forming elements 1 bonded to the substrate 2 by the binder 3. In this embodiment, the image forming element 1 is in the form of a microcapsule comprising a core material 1a and a wall material 1b coating the core material 1a.

In the present invention, "a layer of a binder" may include both a continuous layer of a binder, and a layer of disperse spots of a binder. Further, the image forming element may be disposed in contact with or almost in contact with the surface of the substrate.

In the transfer recording medium according to the present invention, the peripheral surface of each image forming element 1 is not completely covered with the binder 3, and a part of the surface of each image forming element 1 protrudes from the binder. Therefore, the image forming elements 1 are selectively and efficiently transferred to a transfer-receiving medium without hindrance due to the binder.

In the transfer recording medium of the present invention, the image forming element may preferably have a particle size in the range of 1–20 μm, more preferably of 3–10 μm in terms of a number-average particle size.

Herein, the number-average particle size of the image forming element may be measured by means of Coulter counter type II (mfd. by Coulter Electronics Inc.) and determined on the basis of the number the image forming elements. The aperture size adopted herein is 100 μm, and a sample concentration may be 5–20 wt.%. In such measurement, particle sizes of 10,000 or more image forming elements are measured, and such measurement is repeated three times while changing the sample. Thereafter, the number-average particle size is determined by statistical processing.

Further, in a case where image forming elements are bonded to a substrate by a binder, the number-average particle size of the image forming elements may be determined in the following manner by means of an image analyzing device such as Luzex 500 (mfd. by Nireco K.K.) or PIAS-II (mfd. by Pias K.K.).

Thus, image forming elements bonded to a substrate are horizontally disposed so that they are on a microscope side, and then images of the image forming elements through an optical microscope are detected by means of a television camera. At this time, the magnification is appropriately set so that at least 20 particles of image forming elements are present in the measurement area of a monitor. Then, while direct imges of the image forming elements on the monitor are observed, the binary or digitized images thereof are obtained by a digitizing process. At this time, another particle image hindering the particle size measurement such as a foreign particle image may be omitted by use of image processing. Further, two or more image forming elements which are too closely disposed and hence ordinary detected as a single particle may be measured separately by use of image processing.

In the present invention, an absolute maximum length (i.e., the maximum length of distances between two points which are arbitrarily selected on the periphery of each particle image) may be selected as a standard for classification. By using classification intervals of 1 μm the numbers of the image forming elements corresponding to the respective classification intervals are measured. Such operation is repeated, while changing the measurement position so that the total number of the measured image forming elements becomes at least 1,000, whereby a number-average particle size based on the absolute maximum length may be obtained by use of statistical processing.

In the present invention, it is preferred that the surface of each image forming element protrudes from the binder with respect to those which considerably affect a recorded image, more preferably substantially all the image forming elements disposed on the substrate 2. Herein, the proportion of the number of image forming elements partially protruding from the binder to the total number thereof may preferably be 80% or above, more preferably 90% or above, with respect to those having a particle size of 3 μm or above, more preferably substantially all the image forming elements are so disposed on the substrate 2.

The particle size of the image forming element may be measured by means of the above-mentioned image analyzing device in a manner similar to the measurement of the above number-average particle size.

In the present invention, the proportion of the projection area of the image forming elements (i.e., the area of the projected planform of image forming elements as viewed from above) to the area of the substrate surface may preferably be 50% to closest packing.

In the present invention, it is not preferred that adjacent image forming elements are in a state where they are mutually bonded by the binder. In such a case, when one of the adjacent image forming elements is transferred to a transfer-receiving medium, the other image forming element is liable to be transferred together therewith due to the binder. Accordingly, the binder 3 may preferably be disposed on the substrate 2 so that the level or thickness of the binder 3 above the surface of the substrate 2 is suppressed to below one half of the number-average particle size of the image forming elements, more preferably to ⅓ or below, particularly preferably to 1/5 or below of the number-average particle size of the image forming elements.

On the other hand, if the amount of the binder 3 is too small, the adhesion of the image forming element 1 to the substrate 2 undesirably becomes weak. When the level or thickness of the binder layer is 1% or more of the number-average particle size of the image forming elements 1, they may adhere to the substrate 2. Therefore, near the portion in which the image forming element 1 contacts the substrate 2, the level of the binder 3 may preferably be 1% or more, more preferably 2% or more, particularly preferably 3% or more of the number-average particle size of the image forming elements.

In the present invention, as the binder 3, there may preferably be used an epoxy adhesive, polyvinyl alcohol, polyvinyl pyrrolidone, polyacrylamide, a polyester adhesive, a urethane adhesive, an acrylic adhesive, a urethane-acrylic adhesive, an ethylene-vinyl acetate copolymer adhesive, etc. Among these, a thermoplastic binder is particularly preferably used.

For example, in a recording method wherein the material constituting an image forming element abruptly reacts, when provided with heat and light energies, to decrease its transferability to a transfer-receiving medium, an adhesion ($F_1$) between the image forming element and a thermoplastic binder is decreased at a high temperature. As a result, a relationsip $F_a > F_1 > F_b$ may preferably be satisfied at a temperature in the range of from a transfer initiation temperature (i.e., a temperature at which an image forming element starts to be transferred) of an unreacted image forming element ($T_1°$ C.) to that of a reacted image forming element ($T_2°$ C.). Herein, $F_a$ is an adhesion between an unreacted image forming element which has not been provided with light and heat energies, and a transfer-receiving medium such as paper to be recorded. Further, $F_b$ is an adhesion between a reacted or cured image forming element which has been provided with light and heat energies, and a transfer-receiving medium such as paper to be recorded.

Accordingly, if the image forming elements are transferred to a transfer-receiving medium at a temperature satisfying $F_a > F_1 > F_b$, unreacted image forming elements are selectively transferred to the transfer-receiving medium while reacted image forming elements are not transferred thereto.

In view of the storability of a transfer recording medium, the above-mentioned adhesion $F_1$ may preferably be 5 g/cm or above, more preferably 10 g/cm or above, at a temperature of 5°–40° C.

In the present invention, the above adhesions $F_1$, $F_a$ and $F_b$ are measured in the following manner by means of Tensilon RTM-100 (mfd. by Toyo Baldwin K.K.) at a peel angle of 180° and at a peel speed of 300 mm/min.

More specifically, in a case where $F_1$ is measured, a PET film having thereon an about 1 μm-thick layer of a thermosetting urethane adhesive (Hydran HW-311, mfd. by Dainippon Inki Kagaku Kogyo K.K.) is superposed on the image forming element side of a transfer recording medium to be measured so that the adhesive layer contacts the image forming elements, and the resultant laminate is kept at 40° C. for 24 hours, whereby the PET film is bonded to the transfer recording medium.

Then, the transfer recording medium is peeled from the PET film by means of the above-mentioned Tensilon RTM-100 at a peel angle of 180° and at a 5 peel speed of 300 mm/min., whereby the adhesion $F_1$ may be measured. In the above measurement, if such peeling is effected in a thermostat, $F_1$ may be measured at various temperatures.

On the other hand, in a case where $F_a$ or $F_b$ is measured, a transfer recording medium to be measured is prepared in a similar manner as the process for producing the transfer recording medium of the present invention as described hereinbelow, by using a 1 μm-thick layer of a binder of a urethane adhesive (Hydran HW-311, mfd. by Dainippon Inki Kagaku Kogyo K.K.).

Then, the thus prepared transfer recording medium is superposed on a transfer-receiving medium, and is provided with light and heat energies similarly as in the transfer experiment of Example 1 described hereinbelow, and then the resultant laminate is passed through two rollers whereby the transfer recording medium is bonded to the transfer-receiving medium.

Thereafter, the transfer recording medium is peeled from the transfer-receiving medium by means of Tensilon, whereby $F_a$ and $F_b$ may be measured. Incidentally, in a case where $F_a$ is measured, the transfer recording medium is not provided with light and heat energies, and the laminate of the transfer recording medium and the transfer-receiving medium is only passed through the two rollers. On the other hand, in a case where $F_b$ is measured, the transfer recording medium is uniformly provided with light and heat energies, respectively.

In the above measurement, if such peeling is effected in a thermostat, $F_a$ and $F_b$ may be measured at various temperatures. Further, in such a case, the above-mentioned laminate is passed through the two rollers at the same temperature as that of the thermostat.

Such thermoplastic binder used in the present invention may be one having a tackiness or one not having a tackiness, at a room temperature.

More specifically, the thermoplastic binder used in the present invention may include, e.g., an ethylene-vinyl acetate copolymer binder, a polyamide binder, a polyester binder, a polyolefin binder, a polyurethane binder, a polychloroprene rubber binder, a nitrile rubber binder, styrene-butadiene rubber binder, an acrylic resin binder, etc. Among these binders, there may be particularly preferably used those having a softening temperature (according to a ring and ball method of JIS K 2207) of 30°-150° C., more preferably 60°-130° C.

Specific examples of such binder may include: ethylene-vinyl acetate copolymer binders such as MP707, MP709 and MP752 (mfd. by Konishi Bond K.K.), or Hi-Bon 9880, and Hi-Bon 9881H (mfd. by Hitachi Kasei Polymer K.K.); polyester binders such as Polyester LP-011, Polyester LP-022, Polyester LP-033 and Polyester LP-035 (mfd. by Nippon Gosei Kagaku Kogyo K.K.), or Hi-Bon 7662 (mfd. by Hitachi Kasei Polymer K.K.); polyurethane binders such as Hydran AP-10, Hydran AP-20, Hydran AP-30 and Hydran AP-40 (mfd. by Dainippon Inki Kagaku Kogyo K.K.); polyamide binders such as TCL-150 and Hi-Bon 9380 (mfd. by Hitachi Kasei Polymer K.K.); etc.

In the transfer recording medium of the present invention, the image forming element 1 is not restricted to a microcapsular particulate as shown in FIG. 1, but may be a particulate without a wall material 1b which may be obtained by simply solidifying a colorant or coloring agent, and another optional material.

In the present invention, the image forming element 1 (or the core material 1a of a capsular image forming element) may preferably be solid or semisolid. In such a case, since the cohesion of the image forming element is large, the entire image forming element is substantially transferred to a transfer-receiving medium. Further, in a case where the core material 1a of a capsular image forming element is solid or semisolid, the wall material 1b is substantially transferred to a transfer-receiving medium because of the large cohesion or adhesion of the core material 1a.

The particle sizes of the image forming elements 1 may preferably be distributed in the range of ±50% or less, particularly ±20% or less, on the basis of the number-average particle size thereof. The wall material of the microcapsular image forming elexent may preferably have a thickness of 0.1-2.0μ, more preferably 0.1-0.5 μ.

Incidentally, a particulate image forming element 1 may be obtained, e.g., by spray-drying or emulsion-granulating a melt-mixed product of prescribed components.

Known methods may be used for preparing the microcapsular image forming element 1, for example, simple coacervation, complex coacervation interfacial polymerization, in-situ polymerization, interfacial precipitation, phase-separation, spray-drying method, gas suspension-coating, or mechanochemical methods, etc. may be used.

A material constituting the particulate image forming element or the core 1a of the capsular image forming element may vary in a certain extent corresponding to a recording method to be used.

For example, as specifically described hereinbelow, in a recording method wherein a material constituting the image forming element rapidly reacts, when provided with heat and light energies, to decrease the transferability of the image forming element to a transfer-receiving medium whereby a recorded image is formed, the image forming element 1 (or the core material 1a in a case of a capsular image forming element) may preferably comprise a functional or sensitive component, a colorant, and an optional additive. Such functional component is cured or hardened when provided with heat and light energies thereby to decrease the transferability of the image forming element 1 to the transfer-receiving medium.

The wall 1b of the microcapsules may for example be formed of a material including gelatine, gum arabic, cellulosic resins such as ethyl cellulose and nitrocellulose, polymers such as urea-formaldehyde resin, polyamides, polyesters, polyurethane, polycarbonate, maleic anhydride copolymers, polyvinylidene chloride, polyvinyl chloride, polyethylene, polystyrene, and polyethylene terephthalate (PET).

On the other hand, as the substrate 2, there may be used a PET film, a polyamide film, a polyimide film, capacitor paper, etc.

The transfer recording medium according to the present invention may be produced in the following manner.

First, a binder 3 is applied onto a substrate 2 to form a layer of the binder 3 having a level or thickness of below the number-average particle size of image forming elements to be disposed thereon. The level or thickness of the binder layer may preferably be ½ or below the number-average particle size of the image forming elements. Herein, the level of the binder layer is measured from the surface of the substrate 2.

Then, an excess of image forming elements 1 are distributed on the binder layer. At this step, the image forming elements 1 are disposed on the substrate 2 in a multilayer form as shown in FIG. 2A. Herein, "a multilayer form" refers to a state wherein the image forming elements are disposed on the substrate in excess of an amount sufficient to provide a densely packed monoparticle layer of the image forming elements.

Thereafter, image forming elements 1 disposed on the subttrate 2 which are not sufficiently in contact with the binder 3 are removed from the substrate, so that the remaining image forming elements 1 on the substrate 2 are disposed in a monolayer form as shown in FIG. 2B, whereby the transfer recording medium according to the present invention is obtained.

The image forming elements 1 on the substrate 2 are not necessarily disposed in a strict monolayer form, but may be disposed partially in a multilayer form. The proportion of the number of the image forming elements constituting an upper layer (i.e., a layer other than a mono-particle layer disposed close to the substrate) to the number of those constituting a mono-particle layer may preferably be 10% or below, more preferably 5% or below, particularly preferably 1% or below.

In order to form a layer of a binder 3 on a substrate 2, the binder 3 may be applied by means of a blade or an applicator, or may be sprayed on the substrate 2. Further, the binder layer may be disposed by using a gravure printing method.

Further, in order to dispose the image forming elements 1 on the binder 3, there may be used, in addition to the simple distribution method, a method wherein a separately provided substrate having thereon a distributed image forming elements is superposed on a substrate having thereon a layer of a binder 3; or a method wherein a substrate having an applied layer of a binder 3 thereon is moved while contacting the upper portion of an container containing image forming elements 1, etc.

In order to remove an excess portion of image forming elements 1 several methods may be used. Such methods of removing the excess of the image forming elements will be described hereinbelow.

Referring to FIG. 3, there is described a method wherein image forming elements are caused to fall due to gravity and are removed from a substrate.

First, a binder 3 is applied on a substrate 2 by means of a binder-applying container 12 while the substrate 2 is moved at a constant speed by a substrate roller 11. The thickness of the binder layer is controlled by a blade 4.

The binder-applying container 12 not only applies but also reserves as a reservoir for the binder 3.

Then, image forming elements 1 are distributed on the binder layer by means of a hopper 5, so that image forming elements are bonded to the binder 3. In this step, image forming elements 1 which are bonded to the substrate 2 are only those sufficiently contacting the binder 3. A storage container 8 provides the image forming elements 1 to the hopper 5.

Thereafter, the substrate 2 is turned and moved along a rotating drum 6, and the moving direction of the substrate is reversed. In this step, image forming elements 1 not sufficiently contacting the binder 3 fall due to gravity and are recovered by a recovery container 7. The recovery container 7 is connected to the storage container 8 by means of a channel (not shown).

The thus prepared substrate 2 having thereon a monolayer of the image forming elements 1 is passed through a drying oven 9, in which the adhesion of the image forming elements 1 to the substrate 2 is increased by heating to complete the binding, whereby the transfer recording medium according to the present invention is obtained. The steps described above may be conducted sequentially at a constant velocity.

In the above embodiment, in order to remove the excess image forming elements not contacting the binder 3, the direction of substrate 2 is simply reversed. Further, if vibration is applied to the substrate in this step, the image forming elements 1 not sufficiently contacting the binder 3 may be removed instantly and more efficiently.

Figure 4:
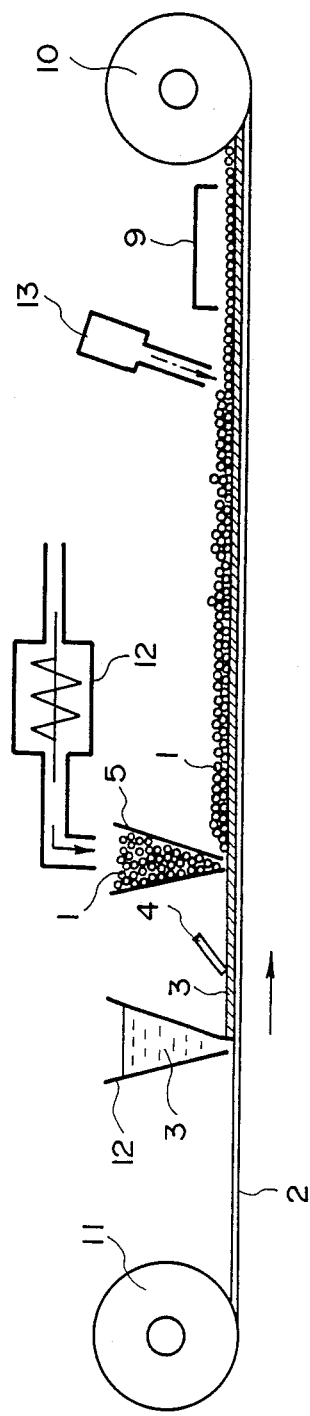

As shown in FIG. 4, image forming elements 1 not sufficiently contacting the binder 3 may be removed by using a gas stream. In such an embodiment, it is not required to reverse the moving direction of the substrate 2 during the process. In the embodiment shown in FIG. 4, a gas-stream jet means 13 jetting or ejecting a gas is disposed between a hopper 5 and a drying oven 9, and image forming elements 1 blown off by the gas stream are recovered into a recovery container (not shown).

In the above-mentioned embodiment, the gas ejected from the gas-stream jet means 13 may preferably be an inactive or inert gas such as air or $N_2$. Further, in a case where a thermosetting adhesive such as an epoxy adhesive is used as the binder, the curing or hardening thereof may also be promoted by jetting a heated gas. The amount of the gas stream may suitably be 0.2–500 $l/cm^2 \cdot min$, more suitably 5–300 $l/cm^2 \cdot min$. Alternatively a gas stream having suction power generated by using a suction means, may be used to separate or remove image forming elements.

Incidentally, in the embodiment shown in FIG. 4, there is provided a mixer 12 sufficient to mix the image forming elements 1 and send them to the hopper 5, instead of the storage container 8 shown in FIG. 3. However, in a case where only one species of image forming elements is used or mixing has been sufficient, a storage container 8 may be used.

Figure 5:
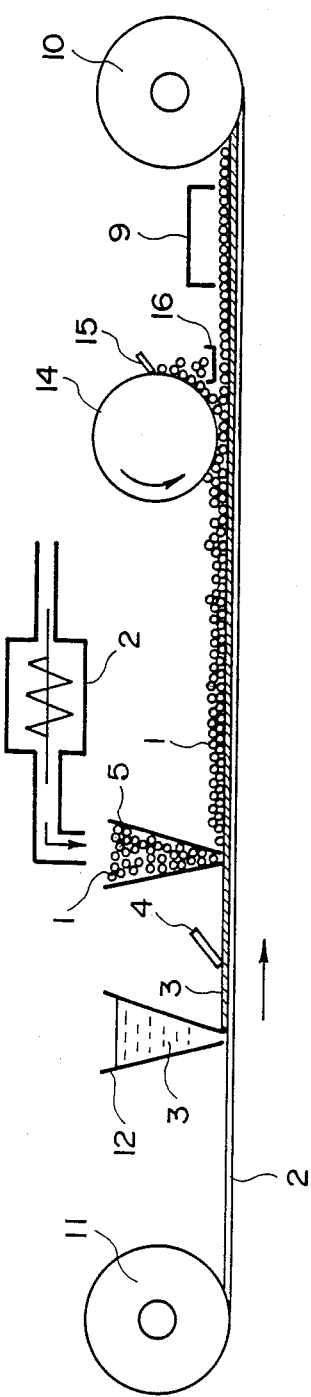

A as shown in FIG. 5, excess image forming elements 1 may be removed by attaching them to an attaching member. In FIG. 5, instead of the gasstream jet means 13 shown in FIG. 4, a roller 14 as an attaching member is provided. The roller 14 rotates in synchrony with the movement of the substrate 2.

Examples of the material constituting the surface of the attaching member may include rollers such as a silicone rubber and a fluorine-containing rubber, or other substances such as resins. Further, in addition to the roller 14, a member such as a revolving belt may be used as the adhesion member. Furthermore, a rotating member, e.g., comprising a porous material which has great ability to hold the attached image forming elements may be used, in a case where a periodic exchange of the attaching member is permissible. In addition, a tape having a weak adhesion may also be used.

Image forming elements 1 attached to the roller 14 are scraped off by a blade 15 disposed near the roller 14, and recovered into a recovery container 16.

FIG. 5 shows a single roller 14 for removal of the image forming elements 1 in a plurality of the rollers 14 may be used in a case where the image forming elements 1 are not sufficiently removed. Further, if the roller 14 is rotated at a speed higher than that of the movement of the substrate 2, or rotated counter to the movement of the substrate, the image forming elements 1 may be attached to the roller 14 more efficiently.

Figure 6:
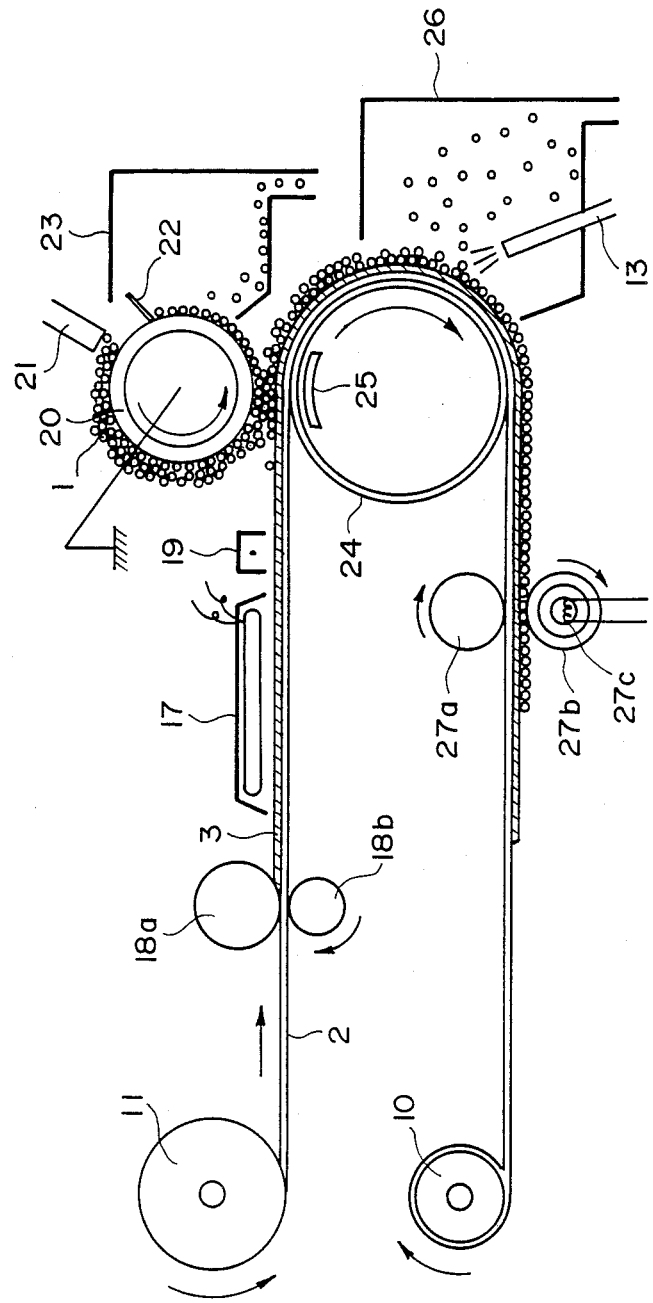

FIG. 6 shows another embodiment of the production process according to the present invention. In an embodiment shown in FIG. 6, an adhesive 3 is applied according to a direct gravure coater method, and after the application of the adhesive 3, it is heated by means of a drying oven 17. Further, in FIG. 6, image forming elements 1 are once carried on the surface of an intermediate member 20 by an electrostatic force, and thereafter are transferred from the intermediate member 20 onto the adhesive 3. In addition to the direct gravure coater method, there may be used a microgravure method, a reverse gravure method, a hot-melt direct gravure method, an applicator method, a wire bar method, etc., as method of applying the adhesive 3.

In FIG. 6, a substrate 2 is first sent out by a substrate roller 11, and an adhesive 3 is applied on the substrate 2 by means of a gravure roller 18a and a backup roller 18b. The substrate 2 coated with the adhesive 3 is sent to a drying oven 17, and a solvent is removed by hot-air drying by means of a sheathe heater.

Then, the adhesive 3 is negatively charged by means of a corona charger 19. The substrate 2 having the negatively charged adhesive 3 thereon is passed between a drum 24 and a stainless transfer cylinder 20 as an intermediate member, covered with a layer of an electroconductive silicone rubber. The space between the surface of the adhesive and that of the intermediate member may suitably be about 0.5–1.5 mm.

A gun 21 for electrostatic painting is disposed above the transfer cylinder 20, whereby image forming elements 1 are applied onto the surface of the transfer cylinder 20 in a multilayer form. The electrostatic painting gun 21 is supplied with a high voltage by a high-voltage generator 30 and a high-voltage cable 30a as shown in FIG. 12, whereby the image forming elements 1 are positively charged. On the other hand, the image forming elements 1 are supplied from a supply reservoir 32 for image forming elements to the gun 21 by means of a compressor 31. The transfer cylinder 20 is grounded and the image forming elements 1 are pushed out toward the transfer cylinder 20 by an air pressure, and carried on the surface of the transfer cylinder 20 due to electrostatic force in a smoothed multilayer form. The voltage charging the image forming elements 1 should preferably be about 1 KV–100 KV.

A layer constituting the multilayer image forming elements disposed on the transfer cylinder 20, with the rotation of the cylinder, is separated from the cylinder 20 and contacts the substrate thereby to move onto the adhesive 3. In this step, it is preferred that a pressure of about 0.5–10 kg/cm$^2$, more preferably of the order of 4 kg/cm$^2$ is applied to the image forming elements 1 by the transfer cylinder 20.

Further, if there is used a Coulomb force generated by the amount of the charge of the adhesive layer due to the corona charger 19 and that supplied to the image forming element, the transfer of the image forming element 1 to the adhesive 3 may be promoted. Even if an adhesive 3 having not so strong adhesion without heating is used, image forming elements 1 may be transferred to the adhesive by using the corona charger 19.

Incidentally, if the adhesion of the adhesive layer is strong, no obstacle is caused even without using the corona charger 19.

Further, in a case where the drum 24 is heated, e.g., by disposing a heater 25 inside the drum 24, the adhesive layer is softened whereby the image forming elements are desirably applied on the adhesive layer in a multilayer state as shown in FIG. 8.

As shown in FIG. 9, the image forming elements 1 are present on the substrate 2 in a multilayer state immediately after the transfer thereof to the adhesive 3. Then, the image forming elements 1 disposed on the substrate surface is blown by an air stream havng a constant strength by means of an air blower nozzle 13, and the image forming elements 1 being not bonded by the adhesive 3 are blown off and removed, whereby only the image forming elements 1 bonded by the adhesive 3 remain on the substrate 2. Incidentally, the step of removal of the image forming element 1 may be conducted by using gravity as shown in FIG. 3, or by using an attaching member as shown in FIG. 5.

Then, the substrate 2 is disposed between pressing rollers 27a and 27b, and pressed and heated. The heating is effected by a heater 27c disposed inside the roller 27b. Incidentally, there are some cases wherein such heating is only required. In the embodiments as shown in FIG. 3 to 5, only the heating due to the drying oven 9 is effected. While depending on the species of the adhesive 3, the adhesive layer may suitably be heated up to about 40°–150° C.

After the image forming elements 1 are disposed by means of the rollers 27a and 27b in the above-described manner, they are pressed whereby the image forming elements 1 which have been pushed up by others and floating above the substrate 2 as shown in FIG. 10 are disposed smoothly and uniformly on the substrate 2 as shown in FIG. 11. The pressure used in this step should preferably be 0.5–20 kg/cm$^2$.

The excess image forming elements 1 removed by the air stream due to the air blower nozzle 13 are recovered into a recovery member 26. A foreign substance is separated from the recovered image forming elements 1 by means of a filter, etc., and thereafter are returned to a supply reservoir 8 as shown in FIG. 3 and may be used again.

In the embodiment wherein the image forming elements 1 are applied on the substrate 2 by using the electrostatic force and the intermediate member 20, the image forming elements 1 having a narrow or sharp distribution of the particle sizes may be applied thereon particularly preferably. More specifically, when the charged image forming elements 1 are applied on the transfer cylinder 20, those having a smaller particle size gather on or near the surface of the transfer cylinder 20, since such image forming elements 1 are charged more easily and have a smaller mass. On the other hand, image forming elements having a larger particle size are disposed far from the surface of the transfer cylinder 20. As a result, such image forming elements disposed far from the surface of the transfer cylinder 20 are selectively applied to the substrate 2, whereby the particle sizes of the image forming elements 1 become uniform.

Further, in order to dispose image forming elements on a substrate 2, a magnetic force may be used. More specifically, as shown in FIG. 7, a magnet 28 is provided inside the drum 24 and a magnetic material such as iron oxide is contained in the image forming element. Thus, the image forming elements 1 disposed near the substrate 2 are strongly attached thereto while the other image forming elements disposed far from the substrate 2 are removed by using a gas stream, etc.

The transfer recording medium according to the present invention may, e.g., be effectively used in a recording method as described in Japanese Laid-Open Patent Application No. 174195/1987 (corresponding to U.S. Ser. No. 869,689) In such embodiment, an image forming element changes its transferability to a transfer-receiving medium when provided with plural kinds of energies, preferably with light and heat energies.

In the embodiment shown in FIGS. 13A-13D, for example, each image forming element 1 contains any one colorant selected from cyan (C), magenta (M), yellow (Y) and black (K). The colorants to be contained in the image forming elements 1, however, are not restricted to cyan, magenta, yellow and black, but may be colorants of any color depending on an intnded use. Each image forming element 1 contains in addition to a colorant, a functional or sensitive component, of which the physical property controlling a transfer characteristic abruptly changes when light and heat energies are applied thereto.

The functional component in the image forming elements 1 has a wavelength dependency depending on the colorant contained. More specifically, an image forming element 1 containing a yellow colorant causes abrupt crosslinking to be cured when a heat flux and a light beam with a wavelength (Y) are applied thereto. Similarly, an image forming element 1 containing a magenta colorant, an image forming element 1 containing a cyan colorant and an image forming element 1 containing a black colorant respectively cause abrupt crosslinking to be cured when a heat and a light beam with a wavelength λ(M), heat and a light beam with a wavelength λ(C), and heat and a light beam with a wavelength λ(K), respectively, are applied thereto. A cured or hardened image forming element 1 does not cause decrease in viscosity even when heated in a subsequent transfer step, so that it is not transferred to a medium to be transfer-printed. The heat and light are applied corresponding to an information signal to be recorded.

In this embodiment of the image forming method, the transfer recording medium according to the present invention is superposed on a thermal head 40, and light is illuminated so as to cover the entire heat generation region of the thermal head 40. The wavelengths of the illumination light are so selected sequentially as to react on image forming elements to be illuminated. For example, if image forming elements 1 to be illuminated are colored in any one of cyan, magenta, yellow and black, light beams having a wavelength λ(C), λ(M), λ(Y) and λ(K), respectively, are successively irradiated.

More specifically, while the transfer recording medium is illuminated, on the image forming element side thereof, with a light beam having a wavelength λ(Y), resistance heating elements 40b, 40d, 40e and 40f, for example, of the thermal head 40 are caused to generate heat. As a result, among the image forming elements 1 containing a yellow colorant, those applied with the heat and the light beam with a wavelength λ(Y) are cured as shown by hatching in FIG. 13A (In FIG. 13B, et seq., the cured elements are also indicated by hatching).

Then, as shown in FIG. 13B, while the image forming elements 1 are illuminated with a light beam with a wavelength λ(M), resistance heating elements 40a, 40e and 40f are caused to generate heat, whereby among the image forming elements containing a magenta colorant, those applied with the heat and the light beam with a wavelength λ(M) are cured. Further, as shown in FIGS. 13C and 13D, while the light fluxes with wavelengths λ(C) and λ(K) are provided, prescribed resistance heating elements are caused to generate heat, whereby image forming elements applied with the heat and light are cured to finally leave a transferable portion or image formed of non-cured image forming elements 1. The transferable portion is then transferred to a transfer-receiving medium a medium to be transfer-printed 41 in a subsequent transfer step as shown in FIG. 13E.

In the transfer step, the transfer recording medium on which the transferable portion has been formed is caused to contact the transfer-receiving medium 41 through the faces and heat is applied from the recording medium side or the medium 41 side, whereby the transferable portion is selectively transferred to the transfer-receiving medium 41 to form a visible image thereon. Accordingly, the heating temperature in the transfer step is so determined that the transferable portion is selectively transferred. Further, in order to effectively carry out the transfer, it is also effective to apply a pressure simultaneously. The pressurization is particularly effective when a transfer-receiving medium having a low surface smoothness is used.

In the above embodiment with reference to FIGS. 13A to 13E, a multi-color image is obtained by using a transfer recording medium according to the present invention. However, a monocolor image may also be produced by using a similar transfer recording medium if a single colorant is used in all the image forming elements. In this case, it is not necessary to have the functional components correspond to respective colorants.

In the transfer recording medium according to the present invention, an image forming element to be cured when provided with light and heat energies comprises, at least, a functional component and a colorant. The functional component comprises a photopolymerization initiator and a monomer, oligomer or polymer having an unsaturated double bond. Further, the image forming element may contain an optional additive such as a binder, a thermal polymerization inhibitor, a plasticizer, or a surface-smoothing agent.

The photopolymerization initiator used in the present invention may include a carbonyl compound, a halogen compound, an azo compound, an organosulfur compound, etc. More specifically, there may be used, e.g., acetophenone, benzophenone, xanthone, thioxanthone; diketones or their derivatives such as benzil, acenaphtylenequinone and camphor-quinone; halogen compounds such as anthraquinonesulfonyl chloride and quinolinesulfonyl chloride; etc. The photopolymerization initiator used in the present invention, however, is not restricted to these compounds.

In order to constitute the transfer recording medium according to the present invention into one adapted for use in multi-color image formation, the image forming elements containing different colorants may preferably have sensitivities to different wavelengths. More specifically, when there are a number (n) of colors of image forming elements, the image forming elements should preferably contain n types of photopolymerization initiators allotted to respective colors and each providing an abruptly changing reaction velocity when irradiated with a particular wavelength of light. These photopolymerization initiators in combination of n kinds are respectively contained in the image forming elements which are distributed to form a layer. Examples of such a combination include one comprising:

a photopolymerization initiator having a maximum sensitivity in a region of about 370–400 nm, such as:

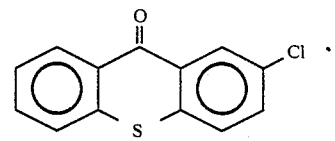

in combination with a tertiary amine compound,
a photopolymerization initiator having a maximum sensitivity in a region of about 300–350 nm, such as:

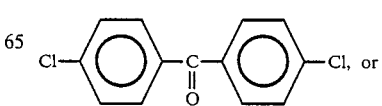

-continued

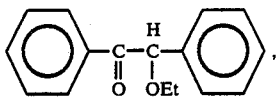

in combination with a tertiary amine compound; and a photopolymerization initiator having a maximum sensitivity in a region of about 400–500 nm, such as: t-butylperoxyisobutyrate, or tetrakis(t-butyldioxycarbonyl)benzophenone, in combination with a sensitizer of

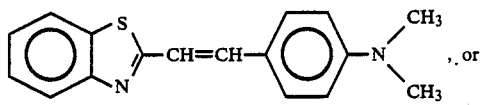, or

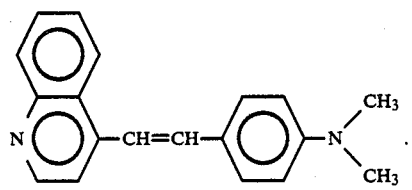

Thus, the maximum sensitivities of the photopolymerization initiators are separated or differentiated from each other, whereby the image forming elements may have sensitivities to different wavelengths. Accordingly, color separation among three colors may be provided by using the above photopolymerization initiators. Further, a full-color recording system may be developed in a similar manner.

Further, in the present invention, a compound having a large absorptivity in a region of ultraviolet to visible wavelength such as an ultraviolet rays-absorbing agent, may be used in combination with the photopolymerization initiator. In such a case, the spectral characteristic of the photopolymerization initiator can be enhanced by narrowing the wavelength region to which the photopolymerization initiator has a sensitivity.

The monomer, oligomer or polymer having an unsaturated double bond may include: urethane acrylates or urethane methacrylates synthesized by a polyaddition reaction of a polyisocyanate (optionally reacted with a polyol, as desired) with an alcohol or amine having an unsaturated double bond; epoxyacrylates synthesized by an addition reaction of an epoxy resin with acrylic acid or xethacrylic acid; polyester acrylates, spiacrylates, or polyether acrylates. The monomer, oligomer or polymer used in the present invention, however, is not restricted to these compounds.

Further, in the present invention, there may be used a polymer comprising a skeleton of polyether, polyester or polyurethane as a main chain, to which a polymerizing or crosslinking reactive group respresented by an acrylic group, a methacrylic group, a cinnamoyl group, a cinnamylideneacetyl group, a furylacryloyl group or a cinnamic acid ester group, is introduced as a side chain. The polymer used in the present invention is not restricted to these compounds.

The above monomer, oligomer or polymer may preferably be semisolid or solid at normal temperature, but may also be liquid as far as it can keep itself semisolid or solid when mixed with a binder as mentioned hereinafter.

The above-mentioned monomer, oligomer or polymer having an unsaturated double bond, and the photopolymerization initiator may be used in combination with a binder. As the binder, there may be used any organic polymer compatible with the above monomer, oligomer or polymer having an unsaturated double bond.

Examples of such organic polymer may include: polyacrylic acid alkyl esters such as polymethyl acrylate and polyethyl acrylate; polymethacrylic acid alkyl esters such as polymethyl methacrylate and polyethyl methacrylate; methacrylic acid copolymers, acrylic acid copolymers, and maleic acid copolymers; chlorinated polyolefins such as chlorinated polyethylene and chlorinated polypropylene; polyvinyl chloride, polyvinylidene chloride, polyacrylonitrile, or copolymers comprising monomers constituting these polymers; polyvinyl alkyl ethers, polyethylene, polypropylene, polystyrene, polyamide, polyurethane, chlorinated rubber, cellulose derivatives, polyvinyl alcohol, and polyvinyl pyrrolidone. The binder used in the present invention is not restricted to these compound. These binders may be used singly or as a mixture of two or more species in an appropriate proportion. Further, waxes may be used as the binder without considering the compatibility or incompatibility thereof.

The coloring component or colorant is a component to provide an optically recognizable image and may be appropriately selected from various pigments and dyes. Specific examples of the colorant include: inorganic pigments such as carbon black, lead yellow, molybdenum red, and red iron oxide; organic pigments such as Hansa Yellow, Benzidine Yellow, Brilliant Carmine 6B, Lake Red C, Permanent Red F5R, Phthalocyanine Blue, Victoria Blue Lake, and Fast Sky Blue; leuco dyes, and phthalocyanine dyes.

Each image forming element may preferably comprise, based on the weight thereof, 10–99 wt.% of a monomer, oligomer or polymer having an unsaturated double bond, 0.1–20 wt.% of a photopolymerization initiator, 0.1–30 wt.% of a colorant, and 0–90 wt.% of a binder.

Further, in the present invention, the image forming element may further comprise an optional additive such as a thermal polymerization inhibitor or a plasticizer.

Hereinbelow, the present invention will be described by way of examples.

EXAMPLE 1.

TABLE 1

| Item | Compound | wt. % |
|---|---|---|
| Polymerizable prepolymer | (CH$_2$=CHCOOCH$_2$CH$_2$O—CONH. ⟨H⟩$_2$—CH$_2$ | 70 |
| Reaction initiator | Irgacure 907 (mfd. by Ciba-Geigy Corp.) | 11 |

TABLE 1-continued

| Item | Compound | wt. % |
|---|---|---|
| Binder | Polymethyl methacrylate (Elvasite 2041, mfd. by Du Pont) | 17 |
| Colorant | Diaresin Red K (mfd. by Mitsubishi Kasei Kogyo K.K.) | 2 |

TABLE 2

| Item | Compound | wt. % |
|---|---|---|
| Polymerizable prepolymer | 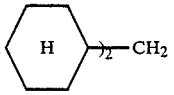 | 75 |
| Reaction initiator | 2-chlorothioxanthone<br>Ethyl p-dimethylaminobenzoate | 1.5<br>3 |
| Binder | Polymethyl methacrylate (Elvasite 2041, mfd. by Du Pont) | 18.5 |
| Colorant | Diaresin Blue (mfd. by Mitsubishi Kasei Kogyo K.K.) | 2 |

A transfer recording medium according to the present invention capable of providing a multi-color image was prepared in the following manner.

Preparation of Microcapsules

Image forming elements in a microcapsular form were prepared in the following manner.

10 g of a mixture of components shown in Table 1 was mixed with 20 g of methylene chloride. The resultant mixture was further mixed with a solution obtained by dissolving a cationic or nonionic surfactant having an HLB of at least 10 and 1 g of gelatin in 200 ml of water, and the mixture was further emulsified by means of a homomixer at 8000-10000 rpm, on heating at 60° C., thereby to obtain oil droplets having an average particle size of 26μ. The mixture was further stirred for 30 min. at 60° C., and then the methylene chloride was distilled off thereby to obtain oil droplets having an average particle size of about 10 μ.

Then, a solution obtained by dissolving 1 g of gum arabic in 20 ml of water was added to the above prepared mixture. An NH4OH (aqueous ammonia solution) was added to the resultant mixture, while cooled slowly, to adjust the pH to 11 or higher, whereby a microcapsule slurry was prepared. Thereafter, 1.0 ml of a 20% aqueous glutaraldehyde solution was slowly added to the slurry thereby to harden the microcapsue walls comprising the gelatine and the gum arabic.

The slurry was subjected to solid-liquid separation by means of a Nutsche funnel, and the solid was dried at 35° C. for 10 hours in a vacuum drier to obtain microcapsular image forming elements.

The above procedure was repeated except that a mixture of components shown in Table 2 was used instead of that shown in Table 1.

The thus obtained two species of the image forming elements were microcapsules comprising the core materials shown in Tables 1 and 2, respectively, and the wall coating the core. The image forming elements had a particle size of 7-15 μm, and a number-average particle size of 10 μm.

The core materials shown in Tables 1 and 2 respectively had a property of changing its transferability when provided with heat and light energies. More specifically, the core material initiated curing when provided with heat and light energies thereby to change its transferability to a transfer-receiving medium. Namely, a transfer initiation temperature (i.e., a temperature at which an image forming element starts to be transferred) of the reacted image forming element became higher than that of the unreacted or substantially unreacted image forming element.

Figure 14:
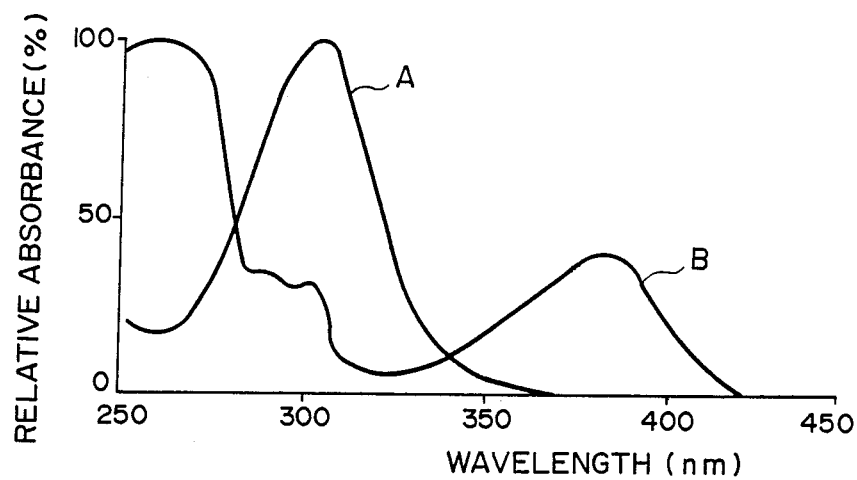
FIGS. 14 and 17 are respectively show an absorption characteristic of photoreaction initiators for use in the transfer recording medium according to the present invention.

More specifically, when the photoreaction initiator contained in the core material shown in Table 1 absorbed light in a range near the peak of an absorption characteristic curve A shown in FIG. 14 while being heated up to 100° C. or higher, initiated a radical reaction and caused polymerization. Based on such reaction, the transfer initiation temperature of the image forming element was elevated from 60°-70° C. to 150° C. or higher. This image forming element provided a color of magenta when transferred to form an image.

On the other hand, when the photoreaction initiator contained in the core material shown in Table 2 absorbed light in a range near the peak of an absorption characteristic curve B shown in FIG. 14 while being heated up to 100° C. or higher, initiated a radical reaction and caused polymerization. Based on such reaction, the transfer initiation temperature of image forming element was elevated from 60°-70° C. to 150° C. This image forming element provided a color of blue when transferred to form an image.

Preparation of Transfer Recording Medium

A binder was applied onto a substrate of a PET (polyethylene terephthalate) film having a thickness of 6 μm and a width of 70 mm by means of an applicator of which gap was set to 0.5-1 mil so as to form a 0.5 to 1.0 μm-thick binder layer after drying, and then dried for about 10 sec by means of a drier.

A 1:1 mixture obtained by uniformly mixing two species of the microcapsules prepared above was distributed in excess on the binder layer which had an adhesiveness and a low fluidity after the drying, and then image forming elements not contacting the binder were caused to fall by gravity and a vibration. After being dried by blowing for 2-3 minutes at a room temperature, a transfer recording medium according to the present invention was obtained.

As a result of a microscopic observation of the thus prepared transfer recording medium, it was found that the upper surface of the microcapsules which was to contact a transfer-receiving paper was not covered with the binder.

The binder used herein comprised a 5 wt. aqueous solution of a PVA (polyvinyl alcohol) having a polymerization degree of about 1400 and a saponification degree of 95 mol %. In order to increase the wetting property of the PVA solution to the PET, it was used after 0.15% of a nonionic surfactant of coconut oil-fatty acid diethylnolamide had been added thereto, on the basis of the weight of the 5 wt.% PVA solution.

Transfer Experiment

By using the transfer recording medium obtained above, a transfer experiment was conducted in the following manner.

Figure 15:
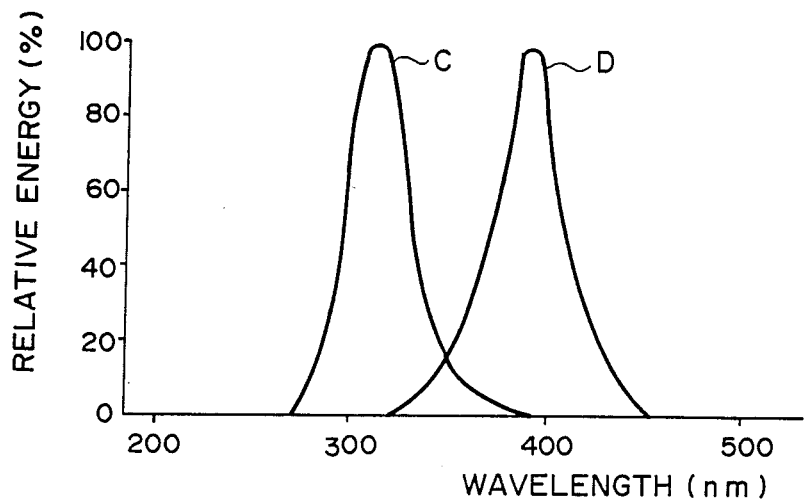
FIG. 15 is a graph showing a spectral characteristic of a lamp used in the method shown in FIG. 13.

Thus, the PET surface of the transfer recording medium was caused to closely contact a hot plate heated up to 120° C., and desired portions of the image forming elements were respectively illuminated for about 50 msec with 10 W-fluorescent lamps (mfd. by Toshiba K.K.) which had peak wavelengths of 313 nm and 390 nm, respectively, as shown by spectral characteristic curves C and D in FIG. 15 and which were disposed at a distance of about 25 mm from the image forming elements.

Thereafter, the recording medium was superposed on a transfer-receiving paper (a medium to be transfer-printed) having a surface smoothness of about 300 sec (Bekk smoothness) so that the image forming element side of the transfer recording medium contacted the paper, and the resultant laminate was passed through rollers mutually contacting under pressure. Herein, the pressure applied between the two rollers was set to about 25 kg/m$^2$, and the surface of the roller contacting the transfer recording medium had been heated up to 90°–100° C. in advance.

The transfer recording medium was peeled from the transfer-receiving paper after the passage through the rollers, whereby high-quality recorded images showing blue, magenta and bluish purple colors were provided on the transfer-receiving paper.

EXAMPLE 2

A binder was applied on a substrate of a PET film having a thickness of 6 μm and a width of 70 mm by means of an applicator of which gap was set to 1 mil so as to form a 0.5 to 1.0 μm-thick binder layer after drying, and then dried for about 10 sec by means of a drier.

A 1:1 mixture obtained by uniformly mixing two species of the microcapsules prepared in the same manner as Example 1 was distributed in excess on the binder layer which had an adhesiveness and a low fluidity after the drying, and then image forming elements (microcapsules) not contacting the binder, were caused to fall. After being pressed by a roller under a pressure of about 1 kg/cm$^2$, a transfer recording medium according to the present invention was obtained.

The thus prepared transfer recording medium was fixed by a resin and cut or sliced to prepare a sample, of which section was then observed through a microscope. As a result, it was found that the level of the binder attached to all the microcapsules above the PET surface was suppressed to below 5μ.

The binder used herein was one obtained by diluting the non-volatile component of an emulsion adhesion agent, Bond CE 500 H (mfd. by Konishi K.K.) with distilled water to a concentration of 15 wt.%.

By using the transfer recording medium of the present invention obtained above, a transfer experiment was conducted in the same manner as in Example 1. As a result, high-quality recorded images showing blue, magenta and bluish purple colors were provided on a transfer-receiving paper.

EXAMPLE 3

A transfer recording medium was prepared in the same manner as in Example 2 except that a pressure of about 30 kg/cm$^2$ was applied by means of a roller after an excess of image forming elements was caused to fall.

The thus prepared transfer recording medium was observed through a microscope in the same manner as in Example 2. As a result, it was found that the binder was attached to some microcapsules at a level of 5 μm or higher above the PET surface, but the surfaces of all the image forming elements at least partially protruded from the binder.

By using the transfer recording medium obtained above, a transfer experiment was conducted in the same manner as in Example 1. As a result, recorded images showing blue, magenta and bluish purple colors were provided on a transfer-receiving paper, but some blurred or dim portions were found in the images.

COMPARATIVE EXAMPLE 1

To 100 parts of a 2 wt.% aqueous solution of the same PVA as in Example 1, 6 parts of a nonionic surfactant of coconut oil-fatty acid diethanolamide was added to prepare a binder solution. Then, 8 g of a 1:1 mixture obtained by uniformly mixing two species of the microcapsules prepared in the same manner as Example 1 was dispersed in 20 g of the above binder solution. The resultant dispersion was applied on a substrate of a PET film having a thickness of 6 μm and a width of 70 mm by means of an applicator of which gap was set to 1 mil and then dried for about 10 sec by means of a drier whereby a transfer recording medium was prepared.

Figure 16:
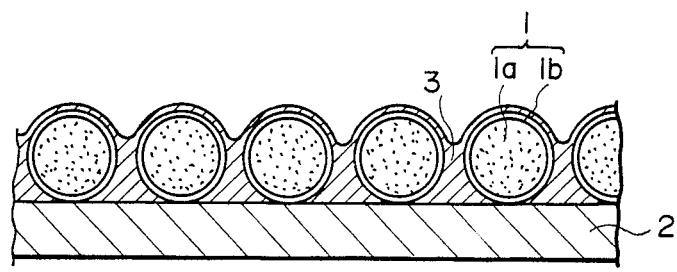
FIG. 16 is a schematic side sectional view showing a recording medium produced in a manner other than the process of the present invention.
Figure 17:
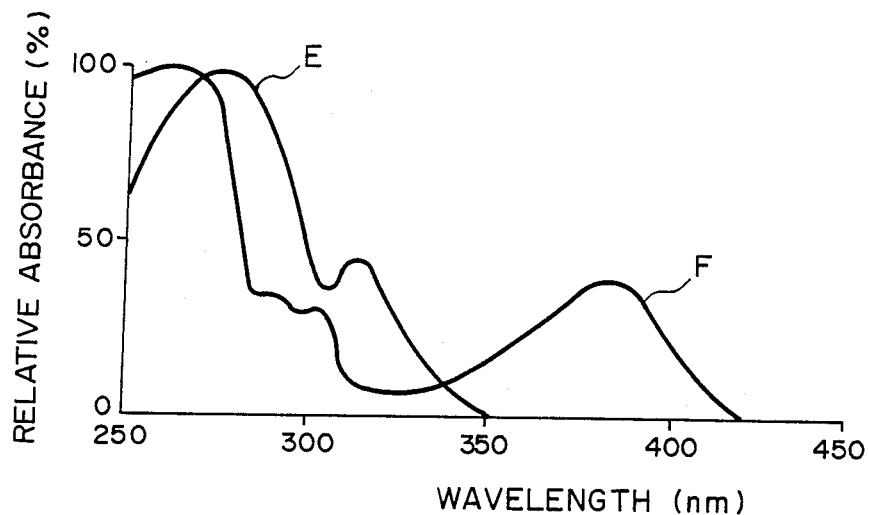
Figure 18:
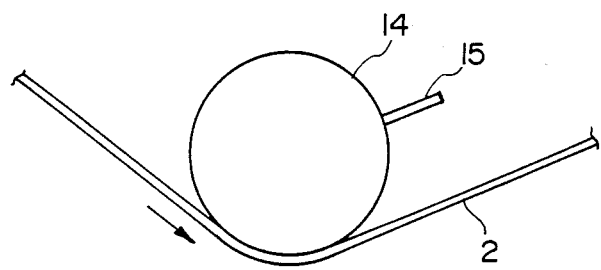
FIG. 18 is an enlarged view of an attaching member used in the system shown in FIG. 5.

In the thus prepared transfer recording medium, the microcapsules were applied on the PET film almost in a monolayer form and almost in closest packing. However, when this transfer recording medium was observed through optical and electron microscopes, it was found that the upper surfaces of the microcapsules were covered with a thin PVA film as shown in FIG. 16.

By using the transfer recording medium obtained above, a transfer experiment was conducted in the same manner as in Example 1. As a result, only images having many blurred or dim portions could be obtained. Further, the colors of the image could not be reproduced faithfully.

EXAMPLE 4

TABLE 3

| Item | Compound | wt. % |
|---|---|---|
| Polymerizable prepolymer | 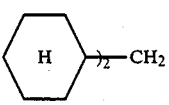 | 68 |

TABLE 1-continued

| Item | Compound | wt. % |
|---|---|---|
| Binder | Polymethyl methacrylate (Elvasite 2041, mfd. by Du Pont) | 17 |
| Colorant | Diaresin Red K (mfd. by Mitsubishi Kasei Kogyo K.K.) | 2 |

TABLE 2

| Item | Compound | wt. % |
|---|---|---|
| Polymerizable prepolymer | 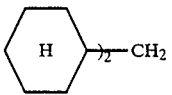 | 75 |
| Reaction initiator | 2-chlorothioxanthone<br>Ethyl p-dimethylaminobenzoate | 1.5<br>3 |
| Binder | Polymethyl methacrylate (Elvasite 2041, mfd. by Du Pont) | 18.5 |
| Colorant | Diaresin Blue (mfd. by Mitsubishi Kasei Kogyo K.K.) | 2 |

A transfer recording medium according to the present invention capable of providing a multi-color image was prepared in the following manner.

Preparation of Microcapsules

Image forming elements in a microcapsular form were prepared in the following manner.

10 g of a mixture of components shown in Table 1 was mixed with 20 g of methylene chloride. The resultant mixture was further mixed with a solution obtained by dissolving a cationic or nonionic surfactant having an HLB of at least 10 and 1 g of gelatin in 200 ml of water, and the mixture was further emulsified by means of a homomixer at 8000–10000 rpm, on heating at 60° C., thereby to obtain oil droplets having an average particle size of 26μ. The mixture was further stirred for 30 min. at 60° C., and then the methylene chloride was distilled off thereby to obtain oil droplets having an average particle size of about 10 μ.

Then, a solution obtained by dissolving 1 g of gum arabic in 20 ml of water was added to the above prepared mixture. An NH₄OH (aqueous ammonia solution) was added to the resultant mixture, while cooled slowly, to adjust the pH to 11 or higher, whereby a microcapsule slurry was prepared. Thereafter, 1.0 ml of a 20% aqueous glutaraldehyde solution was slowly added to the slurry thereby to harden the microcapsue walls comprising the gelatine and the gum arabic.

The slurry was subjected to solid-liquid separation by means of a Nutsche funnel, and the solid was dried at 35° C. for 10 hours in a vacuum drier to obtain microcapsular image forming elements.

The above procedure was repeated except that a mixture of components shown in Table 2 was used instead of that shown in Table 1.

The thus obtained two species of the image forming elements were microcapsules comprising the core materials shown in Tables 1 and 2, respectively, and the wall coating the core. The image forming elements had a particle size of 7–15 μm, and a number-average particle size of 10 μm.

The core materials shown in Tables 1 and 2 respectively had a property of changing its transferability when provided with heat and light energies. More specifically, the core material initiated curing when provided with heat and light energies thereby to change its transferability to a transfer-receiving medium. Namely, a transfer initiation temperature (i.e., a temperature at which an image forming element starts to be transferred) of the reacted image forming element became higher than that of the unreacted or substantially unreacted image forming element.

More specifically, when the photoreaction initiator contained in the core material shown in Table 1 absorbed light in a range near the peak of an absorption characteristic curve A shown in FIG. 14 while being heated up to 100° C. or higher, initiated a radical reaction and caused polymerization. Based on such reaction, the transfer initiation temperature of the image forming element was elevated from 60°–70° C. to 150° C. or higher. This image forming element provided a color of magenta when transferred to form an image.

On the other hand, when the photoreaction initiator contained in the core material shown in Table 2 absorbed light in a range near the peak of an absorption characteristic curve B shown in FIG. 14 while being heated up to 100° C. or higher, initiated a radical reaction and caused polymerization. Based on such reaction, the transfer initiation temperature of image forming element was elevated from 60°–70° C. to 150° C. This image forming element provided a color of blue when transferred to form an image.

Preparation of Transfer Recording Medium

A binder was applied onto a substrate of a PET (polyethylene terephthalate) film having a thickness of 6 μm and a width of 70 mm by means of an applicator of which gap was set to 0.5–1 mil so as to form a 0.5 to 1.0 μm-thick binder layer after drying, and then dried for about 10 sec by means of a drier.

A 1:1 mixture obtained by uniformly mixing two species of the microcapsules prepared above was distributed in excess on the binder layer which had an adhesiveness and a low fluidity after the drying, and then image forming elements not contacting the binder were caused to fall by gravity and a vibration. After being dried by blowing for 2–3 minutes at a room temperature, a transfer recording medium according to the present invention was obtained.

As a result of a microscopic observation of the thus prepared transfer recording medium, it was found that the upper surface of the microcapsules which was to contact a transfer-receiving paper was not covered with the binder.

The binder used herein comprised a 5 wt. aqueous solution of a PVA (polyvinyl alcohol) having a polymerization degree of about 1400 and a saponification degree of 95 mol %. In order to increase the wetting property of the PVA solution to the PET, it was used after 0.15% of a nonionic surfactant of coconut oil-fatty acid diethylnolamide had been added thereto, on the basis of the weight of the 5 wt.% PVA solution.

Transfer Experiment

By using the transfer recording medium obtained above, a transfer experiment was conducted in the following manner.

Thus, the PET surface of the transfer recording medium was caused to closely contact a hot plate heated up to 120° C., and desired portions of the image forming elements were respectively illuminated for about 50 msec with 10 W-fluorescent lamps (mfd. by Toshiba K.K.) which had peak wavelengths of 313 nm and 390 nm, respectively, as shown by spectral characteristic curves C and D in FIG. 15 and which were disposed at a distance of about 25 mm from the image forming elements.

Thereafter, the recording medium was superposed on a transfer-receiving paper (a medium to be transfer-printed) having a surface smoothness of about 300 sec (Bekk smoothness) so that the image forming element side of the transfer recording medium contacted the paper, and the resultant laminate was passed through rollers mutually contacting under pressure. Herein, the pressure applied between the two rollers was set to about 25 kg/m$^2$, and the surface of the roller contacting the transfer recording medium had been heated up to 90°–100° C. in advance.

The transfer recording medium was peeled from the transfer-receiving paper after the passage through the rollers, whereby high-quality recorded images showing blue, magenta and bluish purple colors were provided on the transfer-receiving paper.

EXAMPLE 2

A binder was applied on a substrate of a PET film having a thickness of 6 μm and a width of 70 mm by means of an applicator of which gap was set to 1 mil so as to form a 0.5 to 1.0 μm-thick binder layer after drying, and then dried for about 10 sec by means of a drier.

A 1:1 mixture obtained by uniformly mixing two species of the microcapsules prepared in the same manner as Example 1 was distributed in excess on the binder layer which had an adhesiveness and a low fluidity after the drying, and then image forming elements (microcapsules) not contacting the binder, were caused to fall. After being pressed by a roller under a pressure of about 1 kg/cm$^2$, a transfer recording medium according to the present invention was obtained.

The thus prepared transfer recording medium was fixed by a resin and cut or sliced to prepare a sample, of which section was then observed through a microscope. As a result, it was found that the level of the binder attached to all the microcapsules above the PET surface was suppressed to below 5μ.

The binder used herein was one obtained by diluting the non-volatile component of an emulsion adhesion agent, Bond CE 500 H (mfd. by Konishi K.K.) with distilled water to a concentration of 15 wt.%.

By using the transfer recording medium of the present invention obtained above, a transfer experiment was conducted in the same manner as in Example 1. As a result, high-quality recorded images showing blue, magenta and bluish purple colors were provided on a transfer-receiving paper.

EXAMPLE 3

A transfer recording medium was prepared in the same manner as in Example 2 except that a pressure of about 30 kg/cm$^2$ was applied by means of a roller after an excess of image forming elements was caused to fall.

The thus prepared transfer recording medium was observed through a microscope in the same manner as in Example 2. As a result, it was found that the binder was attached to some microcapsules at a level of 5 μm or higher above the PET surface, but the surfaces of all the image forming elements at least partially protruded from the binder.

By using the transfer recording medium obtained above, a transfer experiment was conducted in the same manner as in Example 1. As a result, recorded images showing blue, magenta and bluish purple colors were provided on a transfer-receiving paper, but some blurred or dim portions were found in the images.

COMPARATIVE EXAMPLE 1

To 100 parts of a 2 wt.% aqueous solution of the same PVA as in Example 1, 6 parts of a nonionic surfactant of coconut oil-fatty acid diethanolamide was added to prepare a binder solution. Then, 8 g of a 1:1 mixture obtained by uniformly mixing two species of the microcapsules prepared in the same manner as Example 1 was dispersed in 20 g of the above binder solution. The resultant dispersion was applied on a substrate of a PET film having a thickness of 6 μm and a width of 70 mm by means of an applicator of which gap was set to 1 mil and then dried for about 10 sec by means of a drier whereby a transfer recording medium was prepared.

In the thus prepared transfer recording medium, the microcapsules were applied on the PET film almost in a monolayer form and almost in closest packing. However, when this transfer recording medium was observed through optical and electron microscopes, it was found that the upper surfaces of the microcapsules were covered with a thin PVA film as shown in FIG. 16.

By using the transfer recording medium obtained above, a transfer experiment was conducted in the same manner as in Example 1. As a result, only images having many blurred or dim portions could be obtained. Further, the colors of the image could not be reproduced faithfully.

EXAMPLE 4

TABLE 3

| Item | Compound | wt. % |
|---|---|---|
| Polymerizable prepolymer | 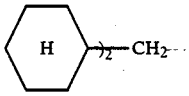 | 68 |

EXAMPLE 8

A transfer recording medium was prepared in the same manner as in Example 7 by bonding two species of microcapsules obtained in Example 4 to a substrate of a PET film having a thickness of 6 μm and a width of 8 mm by means of the above-described device shown in FIG. 6.

By using the transfer recording medium obtained above, a transfer experiment was conducted in the same manner as in Example 4, whereby high-quality recorded images showing blue, magenta and bluish purple colors were provided on a transfer-receiving paper.

EXAMPLE 9

Figure 19:
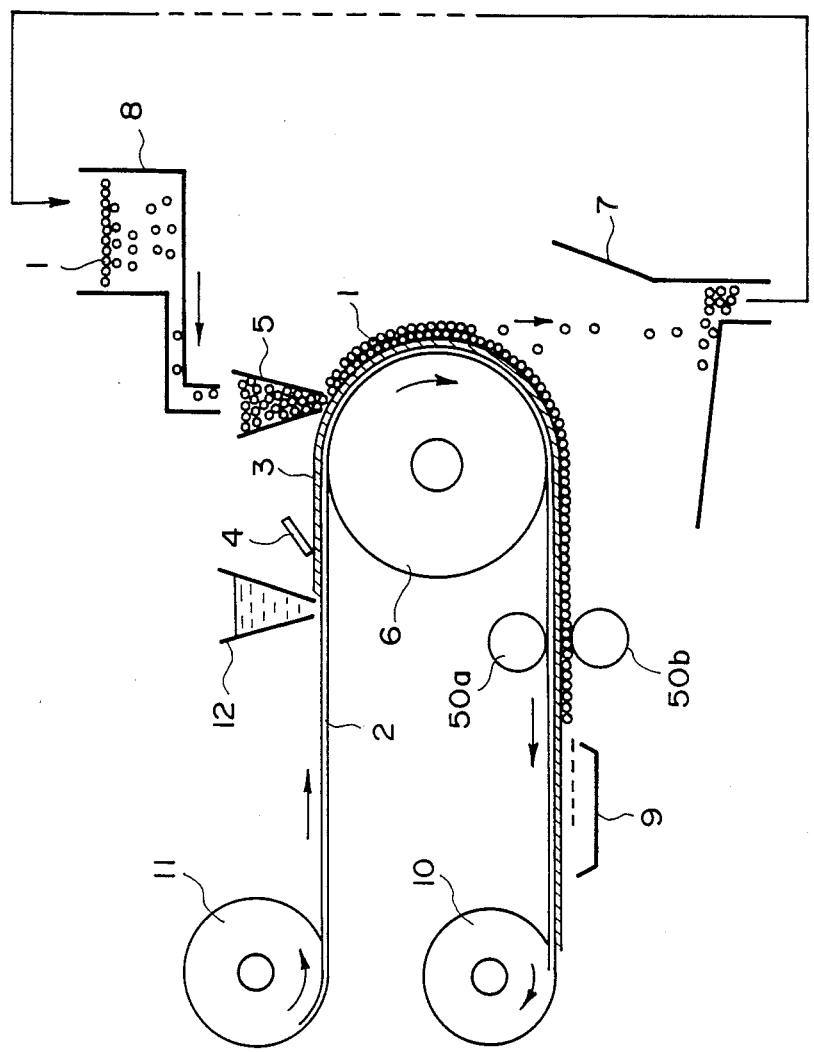

A transfer recording medium was prepared by bonding two species of microcapsules obtained in Example 4 to a substrate of a PET film having a thickness of 6 μm and a width of 8 mm by means of a device shown in FIG. 19.

The device shown in FIG. 19 was the same as that shown in FIG. 3 except that pressing rollers 50a and 50b pressing a substrate 2 on the upside and downside thereof was disposed between a rotating drum 6 and a drying oven 9.

In this example, a transfer recording medium was prepared in the same manner as in Example 4 except that the pressure due to the pressing rollers 50a and 50b was set to 7 kg/cm$^2$.

By using the transfer recording medium obtained above, a transfer experiment was conducted in the same manner as in Example 4, whereby high-quality recorded images showing blue, magenta and bluish purple colors were provided on a transfer-receiving paper.

What is claimed is:

1. A process for producing a transfer recording medium comprising a substrate having a plurality of particulate image forming elements comprising at least a colorant or coloring agent disposed thereon, which comprises:

applying onto the substrate a binder for bonding the image forming elements to the substrate to form a binder layer having a thickness less than the number-average particle size of the image forming elements;

disposing the image forming elements on the binder in excess of an amount sufficient to provide a densely packed mono-particle layer of the image forming elements by means of an intermediate member carrying the image forming elements by an electrostatic force; and Removing excess image forming elements from the substrate so as to leave a densely packed substantially mono-particle layer of image forming elements.

2. A process according to claim 1, wherein the excess of the image forming elements is removed from the substrate by dropping it by gravity.

3. A process according to claim 2, wherein a vibration is applied to the excess of image forming elements when it is dropped by gravity.

4. A process according to claim 1, wherein the excess of the image forming elements is removed from the substrate by supplying a gas stream thereto.

5. A process according to claim 1, wherein the excess image forming elements are removed from the substrate by suction.

6. A process according to claim 1, wherein the excess image forming elements are removed from the substrate by contacting said excess elements with an attaching member, whereupon said elements are transferred to said attaching member.

7. A process according to claim 6, wherein said attaching member comprises a roller.

8. A process according to claim 7, wherein the surface of said roller comprises a silicone rubber.

9. A process according to claim 1, wherein said binder is charged.

10. A process according to claim 1, wherein the image forming elements are pressed toward the substrate after said excess of the image forming elements is removed from the substrate.

11. A process according to claim 1, wherein the binder is heated after said excess of the image forming elements is removed from the substrate.

12. A process according to claim 1, wherein the image forming elements are pressed toward the substrate and the binder is heated after said excess of the image forming elements is removed from the substrate.

* * * * *